US007927905B2

(12) United States Patent
Chow et al.

(10) Patent No.: US 7,927,905 B2

(45) Date of Patent: Apr. 19, 2011

(54) METHOD OF PRODUCING MICROSPRINGS HAVING NANOWIRE TIP STRUCTURES

(75) Inventors: Eugene Michael Chow, Fremont, CA (US); Pengfei Qi, Palo Alto, CA (US)

(73) Assignee: Palo Alto Research Center Incorporated, Palo Alto, CA (US)

(*) Notice: Subject to any disclaimer, the term of this patent is extended or adjusted under 35 U.S.C. 154(b) by 601 days.

(21) Appl. No.: 11/963,507

(22) Filed: Dec. 21, 2007

(65) Prior Publication Data

US 2009/0159996 A1 Jun. 25, 2009

(51) Int. Cl.
*H01L 21/00* (2006.01)

(52) U.S. Cl. ........... 438/52; 257/E21.106; 257/E21.131; 257/E21.582; 257/E23.01; 257/E23.025; 257/E23.164; 257/E23.165; 257/E51.04; 257/E51.038

(58) Field of Classification Search .................... 438/52; 257/E21.106, 131, 582, E23.01, 25, 164, 257/165, E51.04, 38
See application file for complete search history.

(56) References Cited

U.S. PATENT DOCUMENTS

| | | | | |
|---|---|---|---|---|
| 5,314,569 | A * | 5/1994 | Pribat et al. | 117/75 |
| 5,858,862 | A * | 1/1999 | Westwater et al. | 438/503 |
| 5,944,537 | A | 8/1999 | Smith et al. | |
| 5,979,892 | A | 11/1999 | Smith | |
| 6,184,065 | B1 | 2/2001 | Smith et al. | |
| 6,184,699 | B1 | 2/2001 | Smith et al. | |
| 6,213,789 | B1 | 4/2001 | Chua et al. | |
| 6,264,477 | B1 | 7/2001 | Smith et al. | |
| 6,297,063 | B1 * | 10/2001 | Brown et al. | 438/2 |
| 6,392,524 | B1 | 5/2002 | Biegelsen et al. | |
| 6,396,677 | B1 | 5/2002 | Chua et al. | |
| 6,439,898 | B2 | 8/2002 | Chua et al. | |
| 6,560,861 | B2 * | 5/2003 | Fork et al. | 29/842 |
| 6,582,989 | B2 | 6/2003 | Biegelsen et al. | |
| 6,646,533 | B2 | 11/2003 | Biegelson et al. | |
| 6,684,499 | B2 * | 2/2004 | Romano et al. | 29/874 |
| 6,755,956 | B2 * | 6/2004 | Lee et al. | 205/104 |

(Continued)

FOREIGN PATENT DOCUMENTS

| | | | |
|---|---|---|---|
| EP | 1069588 | A2 | 1/2001 |
| EP | 1557843 | A2 | 7/2005 |
| WO | WO2004102582 | A1 | 11/2004 |

OTHER PUBLICATIONS

R. He, D. Gao, R. Fan, A. I. Hochbaum, C. Carraro, R. Maboudian, and P. Yang, "Si Nanowire Bridges in Microtrenches: Integration of Growth into Device Fabrication," Advanced Materials, vol. 17, pp. 2098 2102, 2005.

(Continued)

*Primary Examiner* — Thao X Le
*Assistant Examiner* — Eric W Jones
(74) *Attorney, Agent, or Firm* — Jonathan A. Small

(57) ABSTRACT

A stress-engineered microspring is formed generally in the plane of a substrate. A nanowire (or equivalently, a nanotube) is formed at the tip thereof, also in the plane of the substrate. Once formed, the length of the nanowire may be defined, for example photolithographically. A sacrificial layer underlying the microspring may then be removed, allowing the engineered stresses in the microspring to cause the structure to bend out of plane, elevating the nanowire off the substrate and out of plane. Use of the nanowire as a contact is thereby provided. The nanowire may be clamped at the tip of the microspring for added robustness. The nanowire may be coated during the formation process to provide additional functionality of the final device.

14 Claims, 13 Drawing Sheets

40 46a A 34a 34b 32 30

U.S. PATENT DOCUMENTS

| | | | | |
|---|---|---|---|---|
| 6,777,963 | B2 | 8/2004 | Rutten | |
| 6,856,225 | B1 | 2/2005 | Chua et al. | |
| 6,922,327 | B2 | 7/2005 | Chua et al. | |
| 6,947,291 | B2 | 9/2005 | Chua et al. | |
| 6,958,572 | B2 * | 10/2005 | Merkulov et al. | 313/311 |
| 7,000,315 | B2 | 2/2006 | Chua et al. | |
| 7,022,541 | B1 * | 4/2006 | Yenilmez et al. | 438/52 |
| 7,033,647 | B2 * | 4/2006 | Tang et al. | 427/533 |
| 7,067,098 | B2 * | 6/2006 | Colbert et al. | 423/447.1 |
| 7,208,094 | B2 * | 4/2007 | Islam et al. | 216/2 |
| 7,284,324 | B2 | 10/2007 | Chua et al. | |
| 7,301,199 | B2 * | 11/2007 | Lieber et al. | 257/327 |
| 7,307,271 | B2 * | 12/2007 | Islam et al. | 257/14 |
| 7,408,186 | B2 * | 8/2008 | Merkulov et al. | 257/40 |
| 7,444,856 | B2 * | 11/2008 | Prinz et al. | 73/105 |
| 7,465,954 | B2 * | 12/2008 | Kamins et al. | 257/13 |
| 7,528,002 | B2 * | 5/2009 | Samuelson et al. | 438/94 |
| 7,560,366 | B1 * | 7/2009 | Romano et al. | 438/503 |
| 7,635,867 | B2 * | 12/2009 | Graham et al. | 257/77 |
| 7,804,157 | B2 * | 9/2010 | Sharma et al. | 257/653 |
| 2002/0046953 | A1 * | 4/2002 | Lee et al. | 205/104 |
| 2002/0122766 | A1 * | 9/2002 | Lieber et al. | 423/447.3 |
| 2004/0075464 | A1 * | 4/2004 | Samuelson et al. | 326/37 |
| 2004/0134265 | A1 * | 7/2004 | Mancevski | 73/105 |
| 2005/0017171 | A1 * | 1/2005 | Samuelson et al. | 250/306 |
| 2005/0133254 | A1 * | 6/2005 | Tsakalakos | 174/261 |
| 2005/0133476 | A1 * | 6/2005 | Islam et al. | 216/2 |
| 2005/0161662 | A1 * | 7/2005 | Majumdar et al. | 257/18 |
| 2006/0019472 | A1 * | 1/2006 | Pan et al. | 438/486 |
| 2006/0086314 | A1 * | 4/2006 | Zhang et al. | 117/98 |
| 2006/0213259 | A1 * | 9/2006 | Prinz et al. | 73/104 |
| 2006/0226550 | A1 * | 10/2006 | Dai et al. | 257/763 |
| 2006/0243483 | A1 * | 11/2006 | Kirby et al. | 174/267 |
| 2007/0186628 | A1 * | 8/2007 | Curry et al. | 73/105 |
| 2007/0228583 | A1 * | 10/2007 | Islam et al. | 257/784 |
| 2008/0272299 | A1 * | 11/2008 | Jin et al. | 250/310 |

OTHER PUBLICATIONS

E. Yenilmez, Q. Wang, R. J. Chen, D. Wang, and H. Dai, "Wafer scale production of carbon nanotube scanning probe tips for atomic force microscopy," Applied Physics Letters, vol. 80, pp. 2225-2227, 2002.

A. B. H. Tay and J. T. L. Thong, "High-resolution nanowire atomic force microscope probe grown by a field-emission induced process," Applied Physics Letters, vol. 84, pp. 5207-5209, 2004.

C. Oon and J. Thong, "In situ nanowire growth for electrical interconnects," Nanotechnology, vol. 15, pp. 687-691, 2004.

M. J. Vasile, D. A. Grigg, J. E. Griffith, E. A. Fitzgerald, and P. E. Russell, "Scanning probe tips formed by focused ion beams [IC testing application] ," Review of Scientific Instruments, vol. 62, pp. 2167-2171, 1991.

D. J. Keller and C., Chih-Chung, "Imaging steep, high structures by scanning force microscopy with electron beam deposited tips," Surface Science, vol. 268, pp. 333-339, 1992.

A. Knoll, P. Bachtold, J. Bonan, G. Cherubini, M. Despont, U. Dreschsler, U. Durig, B. Gotsmann, W. Haberle, C. Hagleitner, D. Jubin, M. A. Lantz, A. Pantazi, H. Pozidis, H. Rothuizen, A. Sebastian, R. Stutz, P. Vettiger, D. Wiesmann, and E. S. Eleftheriou, "Integrating nanotechnology into a working storage device,"Microelectronic Engineering, vol. 83, pp. 1692-1697, 2006.

J. Im, M. Lee, S. Myung, L. Huang, S. G. Rao, D. J. Lee, J. Koh, and S. Hong, "Directed assembly of single-walled carbon nanotubes using self-assembled monolayer patterns comprising conjugated molecular wires," Nanotechnology, vol. 17, pp. 3569-3573, 2006.

A. Subramanian, B. J. Nelson, L. Dong, and D. Bell, "Dielectrophoretic nanoassembly of individual carbon nanotubes onto nanoelectrodes," presented at 2005 IEEE International Symposium on Assembly and Task Planning (ISATP), Jul. 19-21, 2005, Montreal, Que., Canada, 2005.

Y. H. Yan, S. Li, L. Q. Chen, M. B. Chan-Park, and Q. Zhang, "Large-scale submicron horizontally aligned single-walled carbon nanotube surface arrays on various substrates produced by a fluidic assembly method," Nanotechnology, vol. 17, pp. 5696-5701, 2006.

Z. F. Ren, Z. P. Huang, J. W. Xu, J. H. Wang, P. Bush, M. P. Siegal, and P. N. Provencio, "Synthesis of large arrays of well-aligned carbon nanotubes on glass," Science, vol. 282, pp. 1105-1107, 1998.

N. A. Kouklin, W. E. Kim, A. D. Lazareck, and J. M. Xu, "Carbon nanotube probes for single-cell experimentation and assays," Applied Physics Letters, vol. 87, pp. 173901-1, 2005.

www.nanochipinc.com/tech.htm, website Copyright 1999-2010.

* cited by examiner

METHOD OF PRODUCING MICROSPRINGS HAVING NANOWIRE TIP STRUCTURES

BACKGROUND OF THE INVENTION

1. Field of the Invention

The present invention relates generally to photolithographically patterned spring contacts, and more particularly to a plurality of such photolithographically patterned spring contacts having nanowire tips, released at one end from a substrate such that the tips are oriented out of the plane of the substrate.

2. Description of the Prior Art

Photolithographically patterned spring devices (referred to herein as "microsprings") have been developed, for example, to produce low cost probe cards, and to provide electrical connections between integrated circuits. Such microsprings are disclosed and described, for example, in U.S. Pat. No. 5,914,218, which is incorporated by reference herein. A microspring is generally a micrometer-scale elongated metal structure having a free (cantilevered) portion which bends upward from an anchor portion which is affixed directly or indirectly to a substrate. The microspring is formed from a stress-engineered metal film (i.e., a metal film fabricated to have a stress differential such that its lower portions have a higher internal compressive stress than its upper portions) that is at least partially formed on a release material layer. The microspring is attached to the substrate (or intermediate layer) at a proximal, anchor portion thereof. The microspring further includes a distal, tip portion which bends away from the substrate when the release material located under the tip portion is removed (e.g., by etching).

The stress differential is produced in the spring material by one of several techniques. According to one technique, different materials are deposited in layers, each having a desired stress characteristic, for example a tensile layer formed over a compressive layer. According to another technique a single layer is provide with an intrinsic stress differential by altering the fabrication parameters as the layer is deposited. The spring material is typically a metal or metal alloy (e.g., Mo, MoCr, W, Ni, NiZr, Cu), and is typically chosen for its ability to retain large amounts of internal stress. Microsprings are typically produced using known photolithography techniques to permit integration of the microsprings with other devices and interconnections formed on a common substrate. Indeed, such devices may be constructed on a substrate upon which electronic circuitry and/or elements have previously been formed.

FIGS. 1A-1C illustrate the basic, prior art process of fabricating stress-engineered cantilevered microsprings 10. With reference first to FIG. 1A, stress-engineered cantilevers 10 are fabricated by depositing and patterning one or more films to form a stress-engineered cantilever 12 with a designed strain-gradient over a sacrificial layer 14, which itself is formed over a dielectric layer 16 pattered over a substrate 18. Deposition conditions and other parameters may be controlled, as known in the art, to tailor the stresses along the elevation (e.g., in various layers) of the stress-engineered cantilever 12. Stress-engineered cantilever 12 can be of a single film type, such as MoCr alloy, where different layers of the film have different stresses. As stress-engineered cantilever 12 is initially formed in a plane which is parallel to the primary plane of substrate 18, we refer to the fabrication of stress-engineered cantilever 12 as being "in-plane." Stress-engineered cantilever 12 may also be composed of different film types with different stresses. Stress-engineered cantilever 12 is patterned and then released, as illustrated in FIG. 1B, by etching away a portion of sacrificial layer 14 underneath the stress-engineered cantilever 12. To lift the spring up and away from the substrate the stress gradient should be such that more compressive layers are disposed closer to the substrate, and the more tensile layers disposed thereover.

After stress-engineered cantilever 12 is released, additional layers 20 can optionally be plated on the surface of stress-engineered cantilever 12, as shown in FIG. 1C, to improve strength and conductivity. In additional, multiple stress-engineered cantilevers 12 may be formed in an overlying relationship such that, for example, a lower stress-engineered cantilever 12 provides structural support for an upper stress-engineered cantilever 12, as disclosed in the aforementioned U.S. patent application Ser. No. 11/292,474.

Stress-engineered cantilevers formed by this process are unique because the process facilitates the formation of arrays 22 of devices with contact points out of the plane in which the devices are manufactured, as shown in FIG. 2. Linear and 2-d arrays can thereby be produced. Typically, array 22 is formed, with a tip-to-tip spacing selected according to the application of the array. For example, for probe testing, the tip-to-tip spacing would match the spacing of contact pads, leads or the like on the device under test.

Another unique aspect of the process used to fabricate array 22 is that the stress-engineered cantilevers 12 are formed from thin films (e.g., 5 um or less) in-plane, that is, in the same plane as the original substrate. This is in contrast to processes used to produce, for example, conventional silicon atomic force microscopy (AFM) tips, where a tip is fabricated from a relatively thick film (10-20 microns), requiring expensive and complex 3D etching techniques, and where the etch sidewall profile strongly effects the shape tip of the tip of the AFM tip.

Such microsprings may be used in probe cards, for electrically bonding integrated circuits, circuit boards, and electrode arrays, and for producing other devices such as inductors, variable capacitors, scanning probes, and actuated mirrors. For example, when utilized in a probe card application, the tip of the free portion of a microspring is brought into contact with a contact pad formed on an integrated circuit, and signals are passed between the integrated circuit and test equipment via the probe card (i.e., using the microspring as an electrical contact).

Microsprings typically terminate at a tip, whose shape may be controlled photolithographically as the microspring is pattered in-plane. In certain applications, the microspring has a tip profile (e.g., an apical point) capable of physically penetrating an oxide layer that may form on the surface to which electrical contact is to be made. In order to provide a reliable contact with a surface to be contacted, the microspring must provide a relatively high contact force (the force which the spring applies in resisting a force oppositely applied from the surface to be contacted). This is particularly true in applications in which the apical point must penetrate an oxide layer. For example, some probing and packaging applications require a contact force on the order of 50-100 mg between the tip and the structure being contacted.

In certain applications, such as probe-based data storage, lithography, imaging, metrology, and printing and biology addition, there is a desire or requirement for extremely sharp microspring tips (<100 nm). In these applications lower forces are often used (<1 micronewton). Current lithographic process have not proven sufficient to provide the desired sharpness. There have been various attempts to provide very fine tip structures in the prior art.

One approach to providing a very fine tip structure for a microspring has been to manually bond a pre-formed nanowire onto the tip of a released microspring. There are several known methods of producing nanowires.

Silicon nanowires—Chemical vapor deposition (CVD) has been widely used to synthesize and grow large quantities of high quality silicon nanowires. The growth involves a vapor-liquid-solid process: vapor phase precursor (e.g., SiH4) decomposes on the surface of catalysts (e.g., Au) when heated up, and forms a liquid alloy. The continuous feeding of Si into the alloy will supersaturate the alloy and Si nanowires will begin to grow elongate.

Silicon nanowires grow preferentially along the <111> direction through epitaxial growth. If the vertical {111} planes are exposed, Si nanowires 24 can grow horizontally, and bridge two opposite {111} planes, as illustrated in FIG. 3 (from R. He, D. Gao, R. Fan, A. I. Hochbaum, C. Carraro, R. Maboudian, and P. Yang, "Si Nanowire Bridges in Microtrenches: Integration of Growth into Device Fabrication," Advanced Materials, vol. 17, pp. 2098-2102, 2005). The density, diameter, and length of the bridging Si nanowire 24 can be well-tuned by controlling the density of catalyst, size of the catalyst, and the distance between the two opposite planes. Growth temperatures are in the range of 400° C. and diameters are typically 10-20 nanometers (nm).

Germanium nanowires—The chemical vapor deposition (CVD) growth strategy for germanium nanowires is very similar to silicon nanowires, which also follows a vapor-liquid-solid process, except that a gas phase precursor will be a germanium-containing gas, such as GeH4 instead of SiH4, and in general the growth temperature will be lower than Si nanowire growth (approximately 300° C.). Typical diameters are 10-40 nanometers (nm).

Carbon nanotubes—Growth of nanometer-scale structures in carbon produce a unique, hollow or tube-like structure. Accordingly, such structures formed of Carbon are commonly referred to as nanotubes. For carbon nanotube growth, CVD growth is also one of the best synthesis methods. The gas phase precursors are carbon containing gases, such as CH4, C2H4, C2H5OH vapor etc; metal catalysts are usually Fe, Co, Ni etc instead of Au for Si and Ge nanowires. Typical growth temperatures are approximately 650° C. and of diameter less than 3 nm.

Nanotubes spread out on a substrate can be placed onto a silicone AFM tip by using micromanipulators. Nanotubes manually attached to probe tips are available as "CNTek carbon nanotube-tipped AFM probes" from Nanoscience Instruments, Inc. (www.nanoscience.com). For many applications, such probes are prohibitively expensive. Furthermore, production of arrays are not practical with this method because the assembly process is insufficiently repeatable in terms of nanotube position and length. In general, given the very small size of these structures, accurately positioning and bonding the nanowire onto the tip of a probe has proven challenging.

Another effort at providing integrated nanowires and microsprings involves growth of nanowires on conventional cantilever tips. Growth of carbon nanotubes on a probe structure has been attempted with using chemical vapor deposition where the catalyst is patterned on the side of an existing silicon etched probe tip. It is asserted that this process produces nanotubes protruding on 90% of an array of probe tips on a wafer, extending 1-10 micrometers beyond the silicon tip. However, this non-uniformity has prohibited use of these structures, as grown, for probing applications. To shorten the nanotubes to sub-1 micrometer extension, an oxidation discharge process has been employed, which necessitates handling each single cantilever in a tapping mode electrical AFM mode setup. Similar to the gluing, the process is essentially serial, and prohibitive in terms of cost, time, and ultimately uniformity.

Field enhanced growth has also been used for nanometer-scale tip production, such as growing tungsten nanowires seeded from metal pads in a tungsten vapor ambient. The process is serial (one tip at a time), cumbersome, and requires precise alignment of a sharp tip counter electrode close to the silicon tip. Nonetheless, nanowires on the ends of silicon tips have been fabricated and used in probing experiments.

Focused ion beam etching and electron beam induced deposition have also been used to produce devices having micromachined nanometer-scale tips, referred to herein as nanotips. Each of these techniques attempts to place a nanowire or nanotube perpendicularly at the micromachined tip of an in-plane probe structure. However, such processes suffer from low uniformity, control, yields, and throughputs due to the difficulty of vertically aligning the nanowires (both in length and in angle relative to the plane of the probe).

What is needed is a way to make nanowires or equivalently, nanotubes, on cantilevers in a parallel process such that two dimensional arrays of uniform nanotips can be readily formed.

SUMMARY OF THE INVENTION

Accordingly, the present invention is directed to a method of manufacturing a of stress-engineered, cantilevered microspring having a nanowire tip, and to a microspring and an array of microsprings so formed. Nanowires (as used herein including both solid structures and hollow or nanotube structures) are grown generally in-plane with the substrate at the tips of the microsprings prior to release of the microsprings from the substrate. Controlled geometry of the nanowires may therefore be provided by standard growth and patterning processes. The microsprings with nanowire tips may then be released from the substrate, causing the microspring tips and hence the nanowire tips to point up, out of the plane of the substrate, due to a relaxing stress gradient. The nanowires may be in electrical communication with the microsprings facilitating the use of the nanowires as contacts, probe tips, and the like. This approach significantly simplifies the integration of uniform nanowires into probe based applications.

According to one aspect of the invention, the basic steps of providing a microspring having a nanowire tip comprise:

Defining a stress-engineered cantilever and appropriate growth boundaries in-plane Defining the nanowire catalyst/seed layers Growth of the nanowires with good control and uniformity Release the stress-engineered cantilever and the nanowire, forming a nanotip array According to another aspect of the present invention, uniform nanowire length can be provided by photolithographically defining a mask which protects a selected length of the grown nanowire from etching. That is, portions of the nanowire not protected by the mask may be removed for example by etching. Length of the nanowire may then be controlled up to the resolution of the lithographic masking process.

According to another aspect of the present invention, a nanowire grown at the tip of a microspring may be clamped at the point of attachment of the nanowire to the microspring to provide improved robustness. This clamping may be accomplished by deposition and patterning of a thin-film layer, taking advantage of the processes and orientation used to form the microspring and nanowire.

According to still another aspect of the present invention, a field enhancement process may be employed to facilitate nanowire growth. Electrodes may be formed of the material ultimately forming the microspring. A potential between these electrodes assists with directionality, thickness, and other attributes of the grown nanowire.

According to yet another aspect of the present invention, catalyst sites for nanowire growth may be deterministically provided on the surface of the microspring. While this results in some out-of-plane growth of a nanowire, the nanowire may be coaxed in-plane, if necessary, and held in place by a clamping structure, again for example photolithographically defined.

According to a still further aspect of the present invention, the microspring and the nanowire may be separately and independently fabricated, then joined together such that the nanowire extends out of plane upon release of the microspring. The nanowire is preferably attached to the microspring prior to spring release, but may alternatively be attached after release. A clamping structure may optionally be employed to improve the robustness of the mechanical connection between the nanowire and the microspring. The nanowire may be attached to the microspring either on the face of the microspring or on a sidewall of the microspring.

Finally, according to still another aspect of the present invention, the nanowire at the tip of the microspring may be coated with a material to obtain a desired functionality. For example, electrical junctions may be formed on the surface of the nanowire. Or, the nanowire may be coated in a biological material, as may be appropriate for nanometer-scale sensing, drug delivery, etc.

The above is a summary of a number of the unique aspects, features, and advantages of the present invention. However, this summary is not exhaustive. Thus, these and other aspects, features, and advantages of the present invention will become more apparent from the following detailed description and the appended drawings, when considered in light of the claims provided herein.

BRIEF DESCRIPTION OF THE DRAWINGS

In the drawings appended hereto like reference numerals denote like elements between the various drawings. While illustrative, the drawings are not drawn to scale. In the drawings.

DETAILED DESCRIPTION OF THE INVENTION

We next present a description of several embodiments of the present invention. The specific requirements for these embodiments vary by application, but probe array requirements for data storage applications are fairly representative of other applications.

Requirement for probe based data storage include:

fine tip resolution (<100 nm, with <30 nm preferred)

robust tips (don't wear, tip stays sharp, consistent position)

uniform tip heights to facilitate alignment to the substrate (height deviation within several microns)

high yield fabrication process (for 100 s to thousands of probes)

adequate conductivity of nanotips

Figure 4:
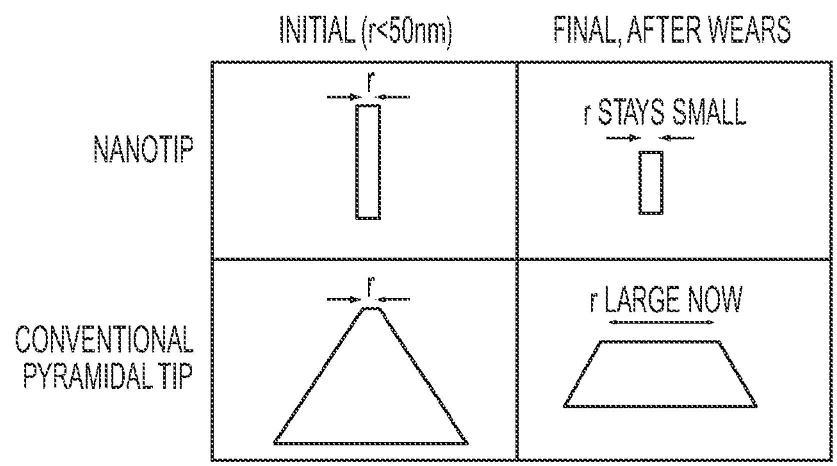
FIG. 4 is a table illustrating the wear characteristics of two different profiles of nanotips for probe applications.

Sharp tips enable small data bits to be written and read—18 nanometer pitches and 2 terabits/in$^2$ have been demonstrated. Equally important though, is the sharpness as a function of time. Inevitably the tips wear—especially for the approaches which uses a hard media substrate. High aspect ratio tips are advantaged because the radius tends to stay small as the tip wears (FIG. 4). Nanotips can be higher aspect ratio than traditional bulk silicon etched based tips. Because the media is not patterned, the tips do not have to be perfectly straight and perfectly vertical from the substrate. However they do need to be sufficiently uniform to be able to repeatedly contact the same spot so that they can read a bit after writing it (media is initially unpatterned, and the writing and reading tips are usually the same). In addition the bit size should be sufficiently uniform, which could depend on multiple factors such as tip radius and force. The force uniformity requirements, for a given cantilever, can translate into a height uniformity requirement. Ideal requirements are force variation of less than 10 nano-Newtons (nN) and tip radius of less than 20 nanometers (nm), with small tip height variation (on the order of several micrometers or less, depending on cantilever probe stiffness).

The tip fabrication process should be readily integrated with the cantilever process. The yield needs to be extremely high, but slight deviations from 100% can be corrected in software and planned for with redundancy. Finally the electrical conductivity of the tip should be appropriate for the writing/reading mechanism. Normally the bulk silicon based tips are not doped for lower conductivity, but if needed the nanotips wires could be doped.

According to the present invention, nanowires or nanotubes are fabricated parallel to the substrate at the tips of in-plane fabricated stress-engineered cantilevers. The stress-engineered cantilevers pull the nanotip out of the plane when released. The nanowire can then be grown parallel to the surface of a substrate, so that multiple processing techniques can be used to control growth uniformity.

The basic steps of a first embodiment of the present invention include:

Define the stress-engineered cantilever

Define the nanowire catalyst/seed layers

Grow the nanowires with good control and uniformity

Figure 5A:
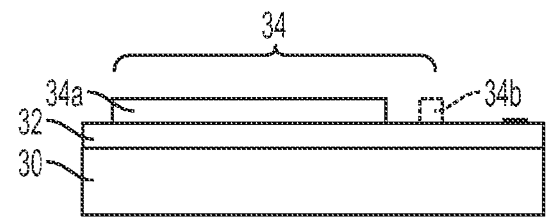
FIGS. 5A and 5B are an elevation view and a plan view, respectively, of a first step in the process of producing a microspring having a nanowire grown in situ at the tip thereof according to an embodiment of the present invention.
Figure 5B:
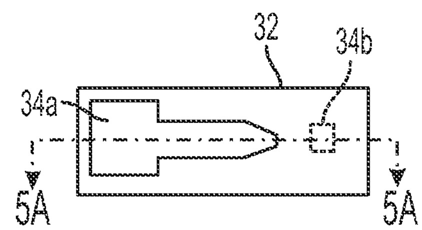

Release the stress-engineered cantilever and the nanowire, forming a nanotip array With reference initially to FIGS. 5A and 5B, there is shown therein and described below a basic process for integrating silicon nanowires onto a stress engineered cantilever. The process begins with the deposition of a sacrificial layer 32 over a silicon, glass, quartz or a polymer such as polyimide substrate 30. Release layer 32 is formed of materials known and used in stressed metal applications, such as Ti, Ni, SiO2, SiN, SiOxNy or Si. Optionally, substrate 30 may have previously formed thereon electronic components and/or circuitry (not shown), or alternatively substrate 30 may be a printed circuit board or printed wiring board. An optional insulating underlayer (not shown) may be deposited and patterned in applications in which electrical insulation is desired between the microspring and other elements of the final plural microspring structure.

Figure 1A:
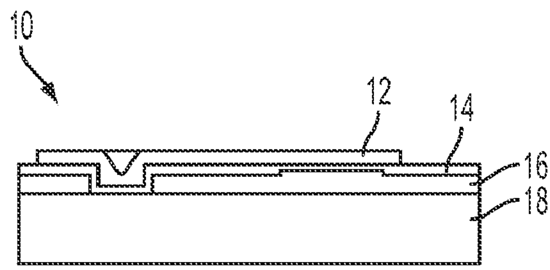
FIGS. 1A through 1C are illustrations of a prior art process for fabrication of a microspring.
Figure 1B:
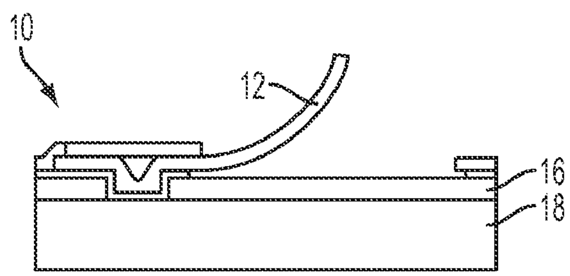
Figure 1C:
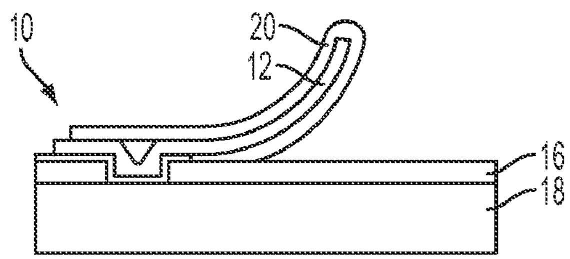
Figure 2:
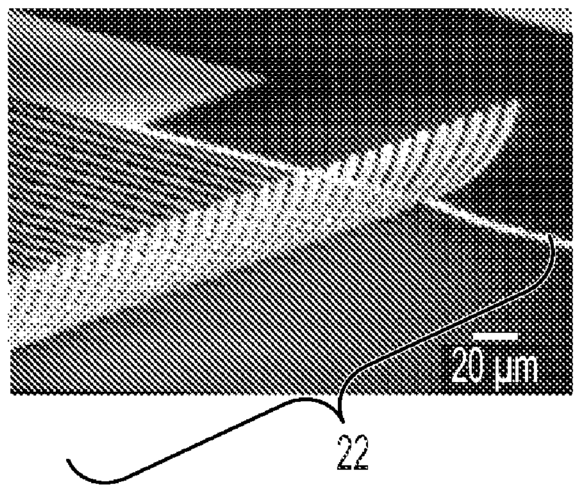
FIG. 2 is a micrograph of an array of microsprings released from a substrate according to the prior art.
Figure 3:
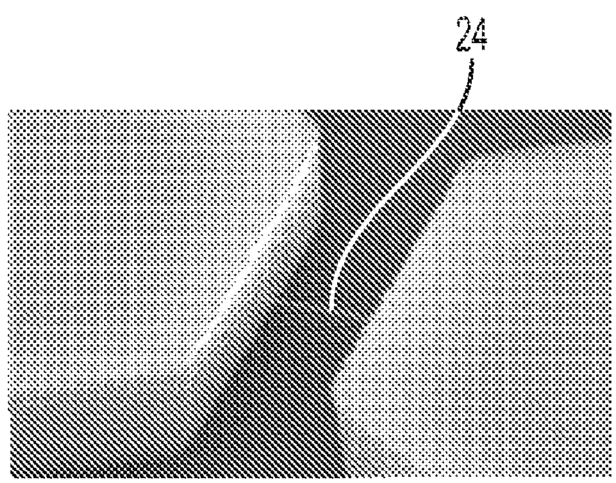
FIG. 3 is a nanowire grown between exposed faces of a seed structure according to the prior art.

A stress-engineered material system 34 is next deposited over the structure, then photolithographically patterned. Ultimately, material system 34 becomes a microspring when released. According to one embodiment, material system 34 comprises prior to release two spaced apart regions 34*a*, 34*b*, which are photolithographically formed and which will be used for the growth of a nanowire or nanotube therebetween. Accordingly, material system 34 may be any of a variety of metals or alloys suitable for the creation of microsprings, such as Mo, MoCr, W, Ni, NiZr, Cu (or a non metal). Material system 34 can also be composed of a low stress single crystal silicon layer and a high stress layer, tensile or compressive. The (111) plane of single crystal silicon has been shown to provide a high yield for growing in-plane nanowires (normal to the sidewalls). This system is illustrate in FIG. 3. A stress-engineered layer such as silicon nitride can be used to pull the silicon layer up during the release.

Material system 34 is deposited in such a way as to develop within the layer a stress differential in a vertical direction across the layer's cross-section. That is, the stress in the system varies from bottom to top. According to one embodiment, material system 34 comprises a single layer of material, and the gas pressure or power is varied during the deposition process to create a stress-engineered single layer (i.e., a layer comprised of a single material) having a desired cross-sectional stress differential. According to another embodiment (not shown), material system 34 is itself comprised of a number of sub-layers, each sub-layer having a desired intrinsic stress. When properly selected, the assembly of sub-layers mechanically and electrically functions as a single system, but the bulk stress differential across the system of layers is a composition of the individual stresses of the sub-layers. These techniques are further described in U.S. Pat. Nos. 5,613,861, and 5,914,218 which are incorporated by reference herein. While formed in a plane, the result of the stress in system 34 is that when the layer is patterned into a microspring structure, two regions are formed. A first, proximal, anchor region attaches the microspring to the substrate (or an intermediate layer over the substrate), and a second, distal, tip region is released from the substrate by removal of a portion of release layer 32. When released, the tip region of the microspring bends out of plane, resulting in a non-planar microspring profile having a desired spring constant. The released structure is discussed further below.

Various combinations of stress engineered layers and nanotips are possible, but the compatibility of the process temperatures needs to be considered. For example, silicon or germanium nanowires can be grown above metal stress-engineered layers as long as the temperatures do not anneal out the stress, meaning an effective limit of approximately 400 C or less. Carbon nanotube manufacturing is typically at much higher temperatures, on the order of 700 C, so the stress engineered layer may be further deposited (or alternatively, deposited in whole) after the nanotube growth. Alternatively, material from which stress-engineered material system 34 is formed should be a high temperature film like a tensile nitride.

According to one embodiment, the single crystal silicon can be purchased as the top layer of an SOI (silicon-on-insulator) wafer, which has thin silicon and thin oxide on a thick substrate. The in-plane cantilever structure can be patterned with standard photolithography and etching techniques.

Figure 6A:
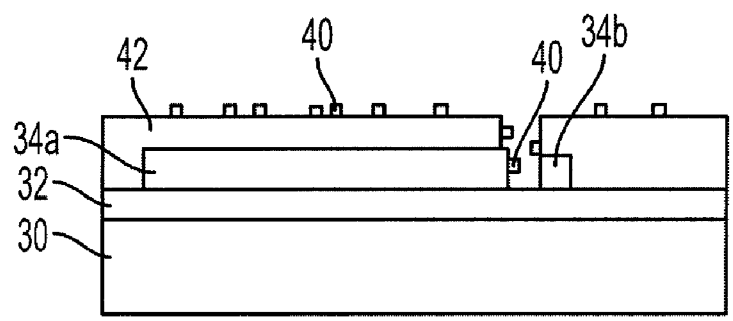
FIGS. 6A and 6B are an elevation view and a plan view, respectively, of the step of providing catalyst sites for the growth of nanowires in the process of producing a microspring having a nanowire grown in situ at the tip thereof according to an embodiment of the present invention.
Figure 6B:
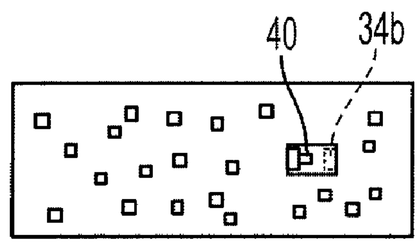

With reference next to FIGS. 6A and 6B, the next step is to deposit nanometer scale metal dots 40 to serve as growth seed (catalyst) sites and to define the diameter of the nanowire to be formed. One method is to flow a solution containing nanodots 40 over a prepatterned liftoff mask 42. Commercially available nanodot solutions include gold particles 10 s of nm diameter. (See www.Aldrich-Sigma.com; www.tedpella.com.) The concentration of particles should be high enough so that one or more particles attaches to the sidewall of the cantilever tip. The liftoff layer (such as photoresist) is then removed to remove unwanted and unneeded seed dots from the structure.

Figure 6C:
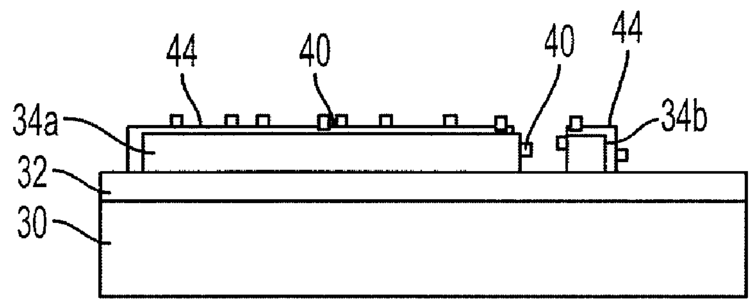
FIG. 6C is an elevation view of the step of providing catalyst sites from the growth of nanowires, including the limiting of growth of nanowires on selected surfaces by the application of a fouling layer in the process of producing a microspring having a nanowire grown in situ at the tip thereof according to an embodiment of the present invention.

According to a variation of this embodiment, the catalyst sites at the locations of nanodots 40 may be "poisoned" to selectively suppress nanowire growth. As illustrated in FIG. 6C, a fouling layer 44 may be formed on surfaces of the stress-engineered material system to poison the catalyst thereover. Molybdenum, for example, is known to prevent nanowire growth from gold seed dots. A thin layer of patterned Mo may be defined such that only areas of portions 34*a* and 34*b* between which nanowire growth is desired are exposed. Accordingly, layer 44 may be comprised of Mo or an Mo alloy. Nanowire growth in all but the regions on layer 44 is thereby limited. If the fouling layer 44 is on the top surface of 34A and 34B but not on the sidewalls, then growth of nanowires should preferentially occur on the sidewalls over the top surface of 34A and 34B. In FIG. 6C the nanodot 40' on the sidewall of 34B is not under a fouling layer 44 and is thus the most likely place for nanowire growth to occur.

Figure 7A:
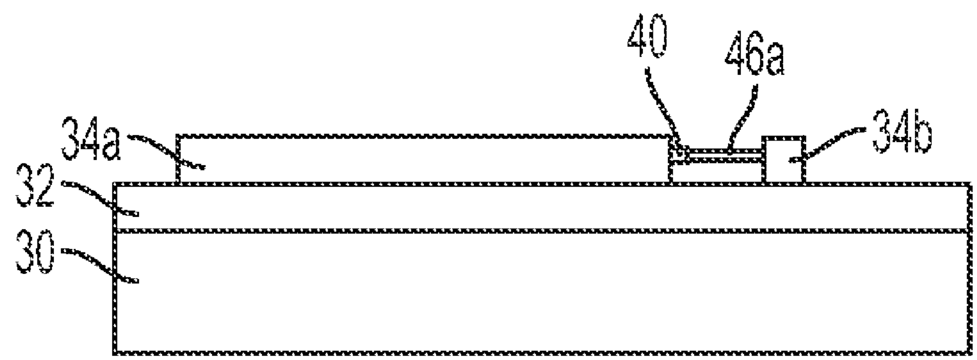
FIGS. 7A and 7B are an elevation view and a plan view, respectively, of the step of growing a nanowire in the process of producing a microspring having a nanowire grown in situ at the tip thereof according to an embodiment of the present invention.
Figure 7B:
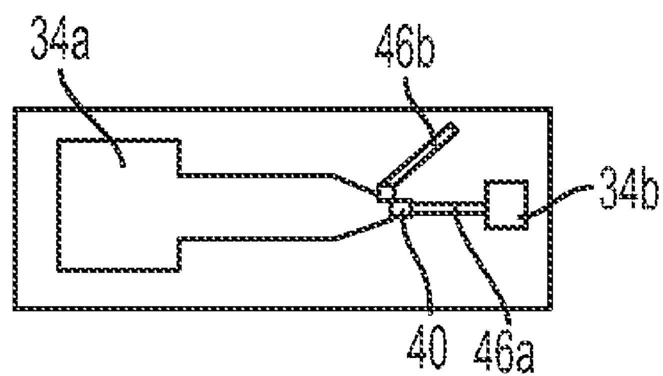

With reference to FIGS. 7A and 7B, nanowires 46*a*, 46*b* are next grown. While growth of nanowires is well known in the art, in one embodiment of the present invention silicon wires may be grown, driven by a vapor phase precursor (using a chemical vapor deposition process), initiating from the gold dots 40 on the (111) sidewalls of the microspring tip. Ideally one wire, primary nanowire 46*a*, grows from each microspring sidewall, and the growth stops when it hits the opposing boundary region. However, it may be common that extraneous secondary nanowires, such as such as nanowires 46*b*, will grow from dots of various exposed sidewall portions of the microspring. Many aspects of the final nanowire may be controlled at this stage, such as the diameter of the wire, tensile properties of the nanowire, etc. It is noted that the growth of nanowires 46 are such that they are in electrical communication with stress-engineered material system 34 so that when stress-engineered material system 34 is released to form a microspring the nanowire may form an electrically conductive tip of the microspring.

Figure 8A:
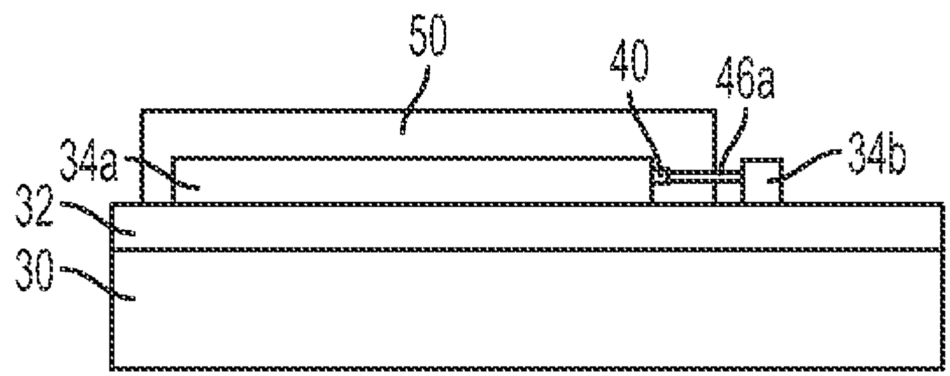
FIGS. 8A and 8B are an elevation view and a plan view, respectively, of the step of masking and defining the nanowire length (and elimination of extraneous secondary nanowires) in the process of producing a microspring having a nanowire grown in situ at the tip thereof according to an embodiment of the present invention.
Figure 8B:
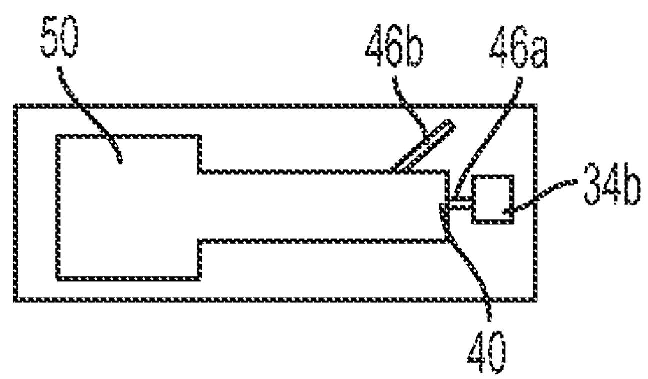

With reference next to FIGS. 8A and 8B, a mask layer 50 may then be applied over the structure, and patterned in order to protect the microspring and a portion of nanowire 46*a* (and portions of wires 46*b*). Etching may then be performed to remove any exposed material, such as exposed portions of nanowires 46*a*, 46*b*, as well as the exposed portion 34*b* of stress-engineered material system 34. It will be noted that this etching step also effectively removes any extraneous secondary nanowires 46*b*. Note also that this step lithographically defines the length (and hence aspect ratio) of primary nanowire 46*a*, permitting very controlled and uniform nanowire length for an array of such nanowires, overcoming the uniform length problem present in many prior art efforts to provide nano-scale probe tips.

Figure 9A:
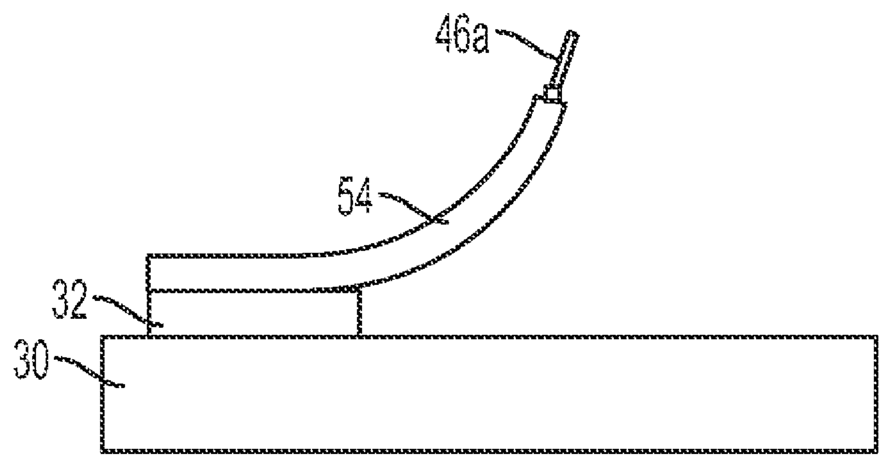
FIGS. 9A and 9B are an elevation view and a plan view, respectively, of the release step in the process of producing a microspring having a nanowire grown in situ at the tip thereof according to an embodiment of the present invention.
Figure 9B:
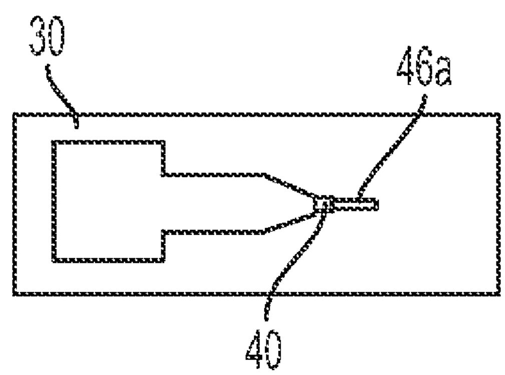

With reference to FIGS. 9A and 9B, mask layer 50 is removed for example by a solvent process. Sacrificial release layer 32 is next etched and portion 34*a* of stress-engineered material system 34 is undercut, releasing a portion 34*a* and thereby forming a microspring 54. The internal stress gradient lifts the microspring 54 out of the plane, taking with it the nanowire 46*a*.

In this embodiment, the vertical (i.e., out of plane) nanotip properties are controlled though multiple mechanisms which are applied while the microsprings are being fabricated in-plane. Such control has heretofore not been possible, particularly as a complete set of attributes controllable as part of a single manufacturing process. Specifically, the following attributes may be process-controlled:

Nanowire axis direction—this attribute may be controlled by selection of the crystal plane to be exposed as the microspring sidewall, electric field guided, fluidics to steer assembly.

Nanowire length (axial)—this attribute may be controlled by the size of the gap photolithographically formed between sections 34*a* and 34*b* of the stress engineered material system 34 and by the masking and etching steps following growth of the nanowire.

Number of nanowires in an array—this attribute may be controlled by the patterning of stochastically deposited nanodots (catalyst sites), or in an alternate embodiment, by deterministic patterning of seed layers (described further below), and by the masking and etching steps following growth of the nanowire.

Size of the nanowires—this attribute may be controlled by the size of the deposited nanodots which act as catalyst sites for nanowire growth, or in an alternate embodiment, by high resolution patterning of the catalyst layer.

Robustness of the nanowires—this attribute is provided by the robustness of the connection at the growth site of the nanowire (attachment at a growth site tends to be more robust than attachment at a point of adhesion of a separately formed nanowire), the control over the nanowire aspect ratio as part of the growth process, and the control of nanowire length by the masking and etching steps following growth of the nanowire.

Functionality of the nanowires—this attribute may be controlled by the pattern-wise dope, coat with polymers, or bio-coated particles.

Figure 10A:
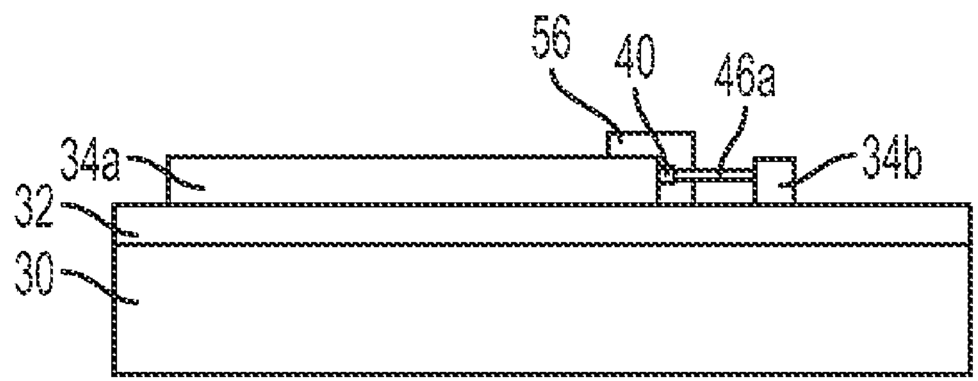
FIGS. 10A and 10B are an elevation view and a plan view, respectively, of the step of forming a clamping structure at the junction of a microspring tip and nanowire in the process of producing a microspring having a nanowire grown in situ at the tip thereof according to another embodiment of the present invention.
Figure 10B:
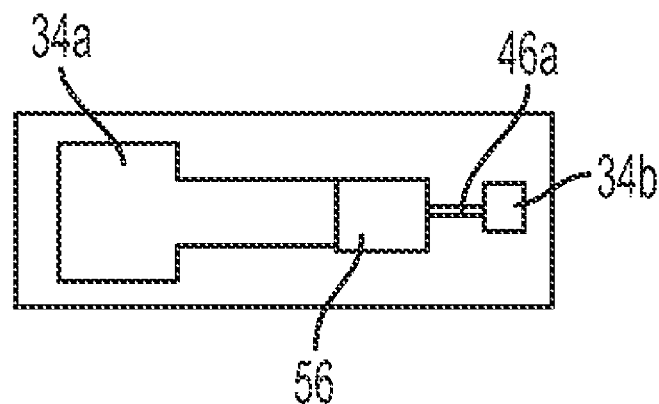
Figure 11A:
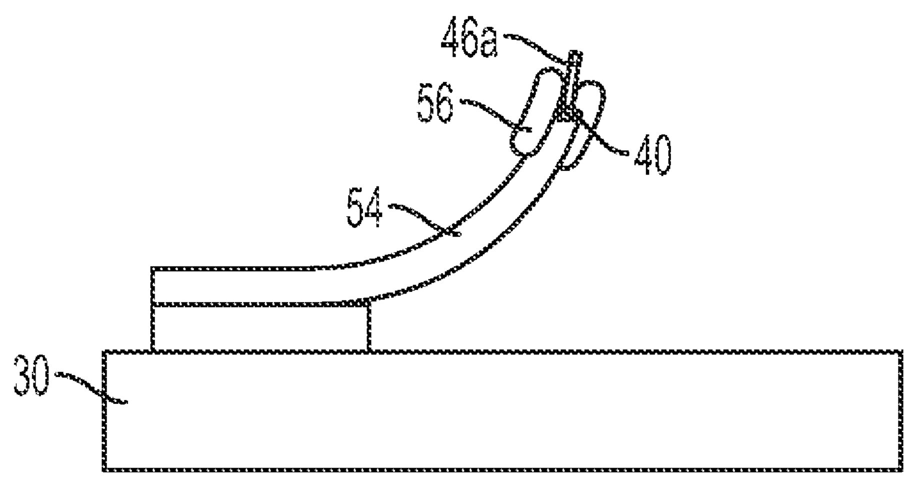
FIGS. 11A and 11B are an elevation view and a plan view, respectively, of the release step in the process of producing a microspring having a nanowire grown in situ at the tip thereof according to the process shown in FIGS. 10A and 10B.
Figure 11B:
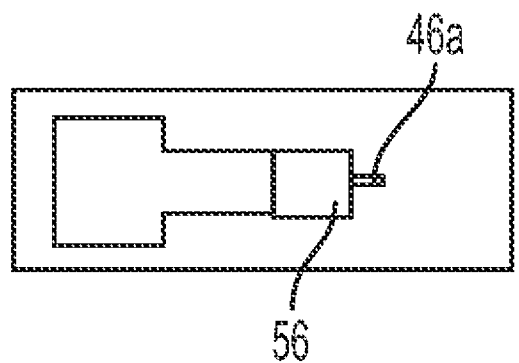

There are many alternative embodiments which have important advantages and applications. According to a first such alternative embodiment, shown in FIGS. 10A, 10B, 11A and 11B, a clamping structure 56 is formed at the junction of the microspring tip and the nanowire for strength. With reference to FIGS. 10A and 10B, which show elevation and plan views, respectively, of a structure in the process of being produced, clamping structure 56 may be comprised of a material such as platinum or gold and is deposited with standard techniques like sputtering or plating, and readily patterned with etching or liftoff techniques such that it encases the junction between portion 34*a* of stress-engineered material system and nanowire 46*a*. This deposition and patterning takes place advantageously prior to release of portion 34*a* of stress-engineered material system from sacrificial layer 14. Improved adherence of nanowire 46*a* to the microspring formed on release of portion 34*a* is obtained. FIGS. 11A and 11B show the final structure including microspring 54, nanowire tip 46*a*, and clamping structure 56 in elevation and plan views, respectively.

It should be noted that in the foregoing, regions 34*a* and 34*b* were comprised of the same material. It will be appreciated however, that regions 34*a* and 34*b* may alternatively be comprised of different materials and/or formed at different times. For example, an oxide layer could serve as a boundary stop region 34*b* and have the advantage that it would etch away with the release layer, reducing the number of steps. Such an oxide material may in fact be the same material as sacrificial release layer 32. Indeed, it is possible to grow nanowires from the tip region of portion 34*a* without a corresponding region 34*b* (hence, region 34*b* is shown in dashed outline), with masking and etching as previously described to control the direction, size, and number of nanowires.

Furthermore, it should be noted that in the prior description nanowire 46 was grown such that it extends between the sidewalls of regions 34*a* and 34*b*. However, the nanowire may, in fact, grow from the upper surface of region 34*a* (as opposed to the sidewall), to either the sidewall or upper surface of region 34*b*, or from the sidewall of region 34*a* to the upper surface of region 34*b*. It is therefore apparent that the long axis of the nanowire may vary a certain degree from being perfectly parallel with the plane of the substrate. Furthermore, the nanowire itself may not be linear at all. In these cases, the nanowire is said to generally extend in the direction of the plane of the substrate, with the important aspect being that upon release of the microspring, the nanowire presents its tip for desired contact rather than the tip of the microspring. Typically this means that the tip of the nanowire extends farther above the surface of the substrate than the tip of the microspring.

Figure 12A:
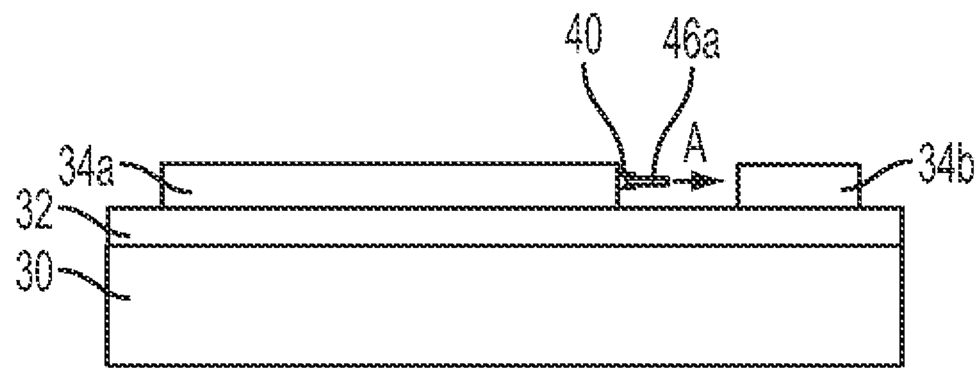
FIGS. 12A and 12B are an elevation view and a plan view, respectively, of the step of field enhanced growth of a nanowire at the tip of a microspring in the process of producing a microspring having a nanowire grown in situ at the tip thereof according to yet another embodiment of the present invention.
Figure 12B:
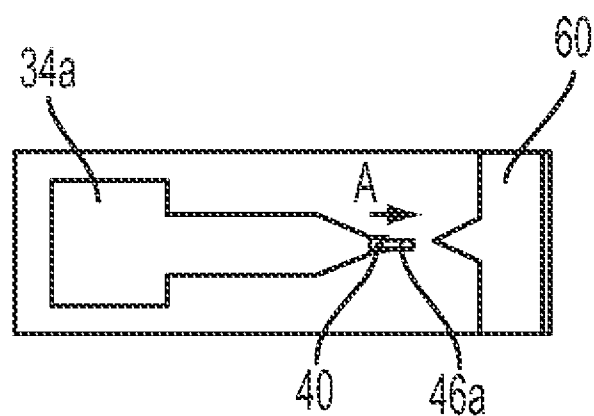

According to another embodiment of the present invention, an in-plane field enhanced structure is used to guide nanowire growth. Such an embodiment in the process of production, is shown in elevation view in FIG. 12A and in plan view in FIG. 12B. Planar processing and etching techniques are be used to form portion 34*b* of stress-engineered material system 34 as a sharp counter electrode 60 to guide growth of the nanowire 46*a*. Such a lithographically aligned counter electrode 60 can be connected so that a single electrode controls growth over the entire wafer. For example, portion 34*a* may be electrically grounded, while a potential applied to electrode 60, resulting in guided growth of the nanowire 46*a* in the direction of arrow A. As with the prior-described embodiments, counter electrode 60 can be removed after nanowire growth (by masking and etching) to allow for the release of the cantilever and lifting of the nanotip. In some applications the counter electrode 60 does not have to be removed, and can remain a permanent part of the final device.

Figure 13A:
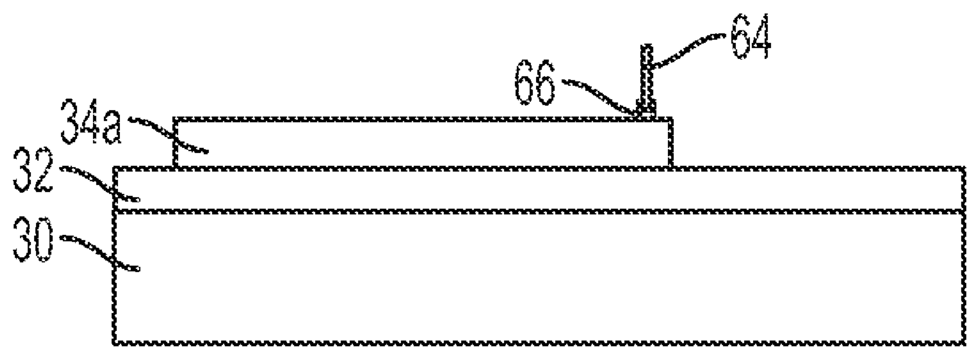
FIGS. 13A and 13B are an elevation view and a plan view, respectively, of the step of controlled catalyst site growth of a nanowire out of plane at the tip of a microspring in the process of producing a microspring having a nanowire grown in situ at the tip thereof according to still another embodiment of the present invention.
Figure 13B:
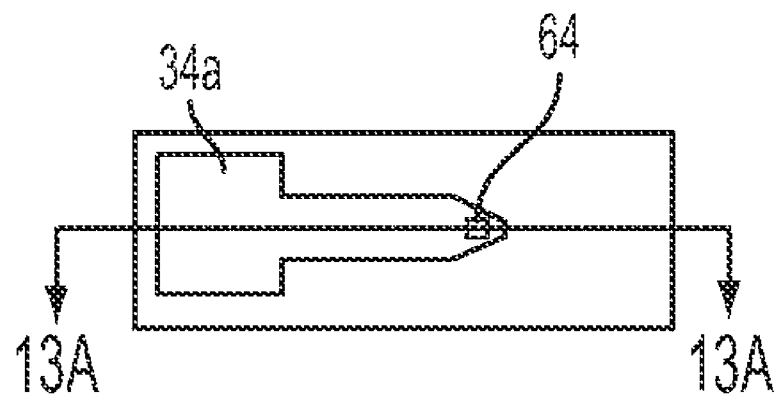
Figure 14A:
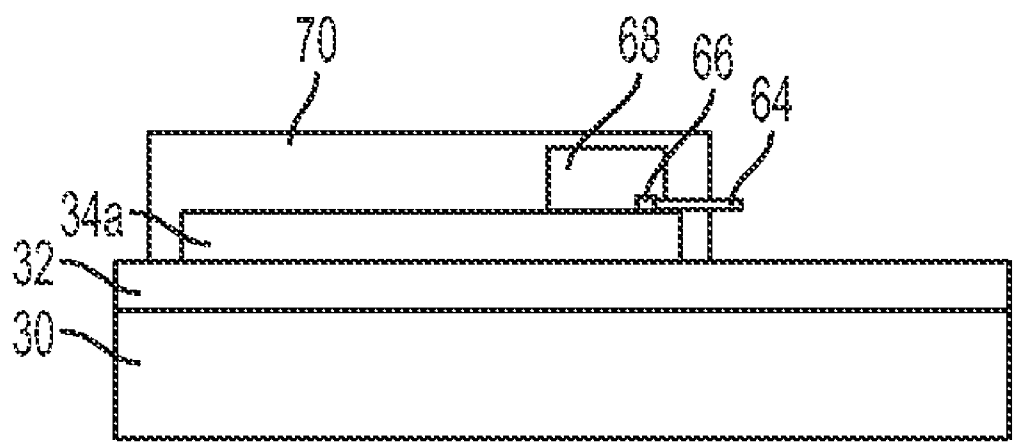
FIGS. 14A and 14B are an elevation view and a plan view, respectively, of the step of clamping in-plane a nanowire grown out of plane at the tip of a microspring in the process of producing a microspring having a nanowire grown in situ at the tip thereof according to the embodiment shown in FIGS. 13A and 13B.
Figure 14B:
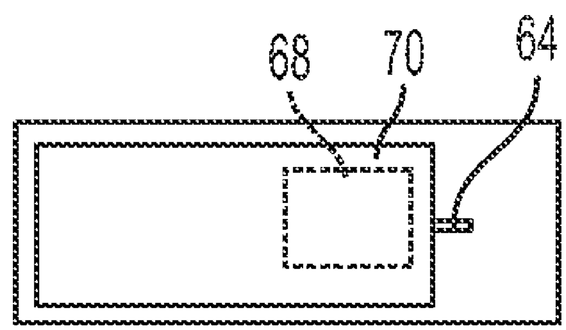
Figure 15A:
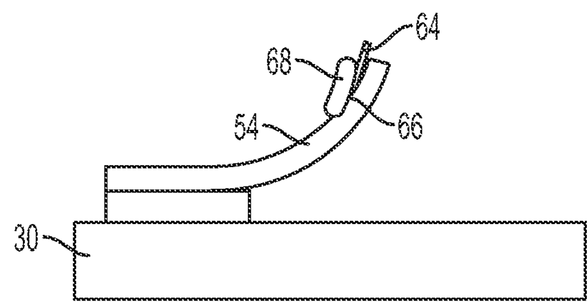
FIGS. 15A and 15B are an elevation view and a plan view, respectively, of the release step in the process of producing a microspring having a nanowire grown in situ at the tip thereof according to the process shown in FIGS. 14A and 14B.
Figure 15B:
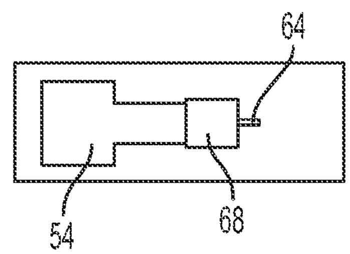

According to still another variation of the present invention, the catalyst sites (locations of nanodots 40) can be patterned directly by assembling nanodots in a solution with liftoff, or with masking of nanostructured substrates (such as iron nanoparticles in mesoporous silica). However, as this is still a stochastic process which will ultimately limit yield. Direct patterning of a catalyst is also applicable for integration with stress engineered devices. Electron beam lithography represents one method which may be used to pattern a nanometer scale dot (20-50 nm in diameter). Microcontact printing and dip pen lithography are alternate methods for patterning. Optimized growth conditions can lead to single wire/tube growth for each catalyst site. With reference to FIG. 13A, which is an elevation view, and FIG. 13B, which is a plan view, according to one aspect of this embodiment, the catalyst sites are patterned on the top surface of portion 34*a* of the stress-engineered material system. Nanowire 64 is then grown vertically from a catalyst site, such as patterned nanodot 66. Loosely adhered nanowires, such as nanowire 64, are controllably tipped over with fluidic force, such as by an directed gas stream, and then clamped by a clamping structure 68 onto stress-engineered material system portion 34*a*, as illustrated in FIGS. 14A and 14B. A masking layer 70 may be deposited and patterned over the structure to define the final length of nanowire 64 as previously described. The final released structure is illustrated in FIGS. 15A and 15B, which are unique in that nanowire 64 is rooted on microspring 54 not at a sidewall of the later, but rather on a planar surface thereof.

Figure 16:
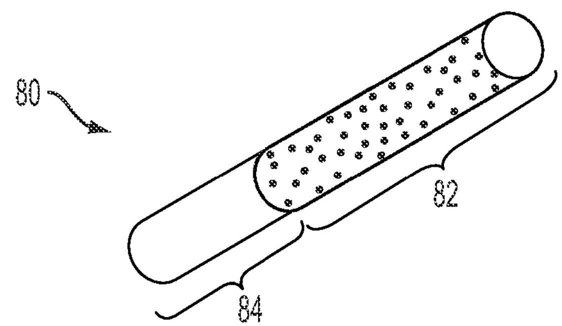
FIG. 16 is a perspective view of a portion of a nanowire showing a selected coating applied to a portion thereof according to yet another embodiment of the present invention.

According to another embodiment described herein, functionalized nanotips, as illustrated in FIG. 16, may be provided at the tips of the microsprings. Following growth of nanowire 80, a coating may me selectively applied to a portion thereof, such as distal portion 82, leaving the remainder 84 of nanowire 80 uncoated. The coating may be applied by way of a standard thin film or other appropriate process. A horizontally grown nanowire or nanotube can thereby be readily functionalized for a sensing or biochemical application. For example, part of the tip can be doped to form an electronic heterojunction for measuring a specific chemical concentration such as proton concentration (pH) or the like. Furthermore, biological coatings may be applied to the nanowire, or nanoparticles can be attached to well defined portions of the nanowires, for sensing or drug delivery on a nanometer scale.

According to a final embodiment of the present invention, prefabricated nanowires may be attached to prefabricated microsprings in-plane, prior to release of the microsprings from the substrate. According to this embodiment, the microsprings are formed as previously described. In one variation, first region 34A and possibly second region 34*b* are formed (e.g., FIG. 5A). Individual single or multiwall carbon nanotubes or nanowires in solution may then be assembled between portions 34*a* and 34*b* using Langmuir-Blodgett film monolayer protocols. A Langmuir-Blodgett film can be made by floating nanowires or carbon nanotubes on water surface inside a teflon trough with pressing bars. When the bars are pressed, the floating nanowires or carbon nanotube will be assembled and aligned. The nanowire or carbon nanotube assembly direction can be aligned with the microspring long axis direction so that nanowires or carbon nanotube can be attached to the microspring tips with the desired orientation. (See, D. Whang, S. Jin, Y. Wu and C. M. Lieber, "Large-Scale Hierarchical Organization of Nanowire Arrays for Integrated Nanosystems," Nano Lett. 3, 1255-1259 (2003)).

According to another variation of this embodiment, surface energy techniques can be used to assemble pre-fabricated nanowires. A patterned hydrophilic film on a cantilever tip region (such as 34A) would attract nanowires in solution to that region. Self assembled monolayers can be used to control the surface energy. See for example see S. Liu, J. B-H. Tok, J. Locklin Z. Bao, "Assembly and Alignment of Metallic Nanorods on Surfaces with Patterned Wettability", Small, Vol. 2, No. 12, p. 1448-1453, 2006; B. R. Martin, S. K. St. Angelo, T. E. Mallouk, "Interactions Between Suspended Nanowires and Patterned Surfaces", Advanced Functional Materials, Vol 12, No. 11-12, pp. 759-765, 2002.

According to still another variation of the present embodiment, dielectrophoretic or electrophoretic forces are used to assemble single tubes and grow them between regions 34*a*, 34*b*. An electric field between two patterned conductive regions (such as 34A, 34B) can be used to assemble pre-fabricated nanowires in a controlled manner. For example, an alternating electric field across a gap can assemble carbon nanotubes using diaelctrophoretic forces; see "L. A. Nagahara, I. Amlani, J. Lewenstein, R. Tsui, "Directed placement of suspended carbon nanotubes for nanometer-scale assembly", Vol. 80, No. 20, pp. 3826-3828, 2002). Similarly, electrophoretic forces can be used to assemble a nanowire which has its own electric charge. A constant electric field between two conductors, such as 34A and 34B could be used direct such a nanowire onto the tip region of the cantilever. The nanowires follow the electric field lines, so they could be directed to assemble in a designed direction with respect to the cantilever tip region 34A. If the nanowire had a positive charge on one side and a negative charge on the other, the positive end would go to the negative voltage electrode (could be 34A) and the negatively charged end of the nanowire would move towards the positive voltage electrode (could be 34B).

In still another variation, microfluidic channels are used for assembling bundles of nanotubes or nanowires. This microfluidic method has been demonstrated to align nanowires with good control. Silicone mode form channels are used to allow a solution containing nanowires to pass therethrough. Some nanowires will be aligned when passing through the channels, and attach to the substrate. The flow direction may be aligned with the long axis of the microsprings, and the aligned nanowires thereby attached with the desired orientation. (See, Y. Huang, X. Duan, Q. Wei, and C. M. Lieber, "Directed Assembly of One-Dimensional Nanostructures into Functional Networks," Science 291, 630-633 (2001)).

Regardless of the technique used to manipulate the nanowires on the microsprings, once the nanowires are satisfactorily placed, a clamping layer may be applied in order to secure the nanowires in place, and the structure may be masked and etched to remove undesirable nanowires, to control the length of the nanowires, to release the microspring, to remove the region 34*b*, etc., as previously described. A microspring curving upward out of the plane of the substrate having one or more nanowires of desired length and orientation is obtained. An array of such devices may just as easily be obtained.

While a plurality of preferred exemplary embodiments have been presented in the foregoing detailed description, it should be understood that a vast number of variations exist, and these preferred exemplary embodiments are merely representative examples, and are not intended to limit the scope, applicability or configuration of the invention in any way. For example, the majority of the embodiments described above have focused on the production of a single nanowire at the tip of a microspring. However, it is entirely within the scope of the present invention to produce a structure having a plurality of such nanowires at the tip of the microspring, depending solely on the intended application of the structure so obtained. Furthermore, the description herein illustrates the production of a single microspring with nanowire formed thereon. However, any of the embodiments described herein may produce an array of such devices. The array may be a linear array (tips aligned in a single row), a two-dimensional array (tips varying in two dimensions in a plane above the substrate), or other suitable arrangement as a function of the intended application of the array. Therefore, the foregoing detailed description provides those of ordinary skill in the art with a convenient guide for implementation of the invention, by way of examples, and contemplates that various changes in the functions and arrangements of the described embodiments may be made without departing from the spirit and scope of the invention defined by the claims thereto.

What is claimed is:

1. A method of manufacturing a microspring having an in situ grown tip, comprising:

depositing over a substrate a sacrificial release layer;

depositing over said sacrificial release layer a stress-engineered layer in a first plane;

patterning said stress-engineered layer to define a first region in said first plane comprising a microspring body, said microspring body including an anchor portion and a tip portion, and further to define a first region proximate said tip portion and a second region separated from said microspring body and opposite said first region such that there is a gap between a first region and said second region;

growing a nanowire between and attached at its ends to said first region and said second region, respectively, said nanowire extending longitudinally in said first plane;

cutting said nanowire after growth such that a first end remains attached to said first region and said second end is separated proximate said second region, said nanowire thereby extending from said first region in said first plane to a desired length; and removing a portion of said sacrificial release layer located under at least said tip portion of said microspring body such that stress within said stress-engineered layer causes said tip portion, with said nanowire, to curve out of said first plane, while said anchor portion remains attached over said substrate.

2. The method of claim 1, further comprising defining a catalyst location for initiating growth of said nanowire.

3. The method of claim 2, wherein:

defining a catalyst location comprises:

applying to at least said first region and second region a suspension containing nanodots; and evaporating said suspension such that said nanodots remain on at least said first region and second region.

4. The method of claim 3, wherein said defining a catalyst location further comprises:

prior to applying said suspension, applying a fouling layer on the surface of said first region and said second region, other than the locations thereof at which said nanowire is to be grown, such that effective catalyst sites are prevented from forming over said fouling layer.

5. The method of claim 2, wherein said defining a catalyst location comprises depositing then patterning a layer containing nanodots which may serve as catalyst locations.

6. The method of claim 1, wherein said cutting said nanowire comprises forming a mask structure over and encasing said first region of said stress-engineered layer and a first portion of said nanowire, etching so as to remove other than said first portion of said nanowire, and removing said mask structure.

7. The method of claim 1, further comprising applying a clamping structure over and around at least the point of connection between said first region and said nanowire prior to removing a portion of said sacrificial release layer.

8. The method of claim 7, wherein said clamping structure contains platinum.

9. The method of claim 7, wherein said clamping structure contains gold.

10. The method of claim 1, wherein said growing a nanowire further comprises applying a voltage potential to at least one of said first or second regions of said stress-engineered layer to thereby create a local electric field which guides the growth of said nanowire between said first and second sidewalls.

11. The method of claim 10, further comprising lithographically patterning said first and second regions such that they are closest together at a relatively sharp point of one or both of said first and second regions prior to the growth of said nanowire.

12. The method of claim 1, wherein said depositing a stress-engineered layer comprises depositing said stress-engineered layer over a single-crystal silicon layer, such that said first and second regions present the <111>plane of said single crystal silicon.

13. The method of claim 1, further comprising coating at least an end portion of said nanowire furthest from the point of connection between said first region and said nanowire with a selected material after growing said nanowire but before removing a portion of said sacrificial release layer.

14. The method of claim 1, further comprising doping at least an end portion of said nanowire furthest from the point of connection between said first region and said nanowire after growing said nanowire but before removing a portion of said sacrificial release layer.

* * * * *